US007129590B2

(12) United States Patent
Watson

(10) Patent No.: US 7,129,590 B2

(45) Date of Patent: Oct. 31, 2006

(54) STENCIL AND METHOD FOR DEPOSITING MATERIAL ONTO A SUBSTRATE

(75) Inventor: Jeffrey R. Watson, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/438,526

(22) Filed: May 14, 2003

(65) Prior Publication Data

US 2004/0229406 A1 Nov. 18, 2004

(51) Int. Cl.
*H01L 31/0203* (2006.01)

(52) U.S. Cl. ...................... 257/787; 257/789; 257/790; 29/841; 29/855; 438/951

(58) Field of Classification Search .................. 29/841, 29/855; 257/787, 789, 790, E21.499, E21.502, 257/E23.001, E23.116, E33.056, E33.059; 438/951

See application file for complete search history.

(56) References Cited

U.S. PATENT DOCUMENTS 4,004,044 A * 1/1977 Franco et al. .......... 204/192.32
4,272,561 A * 6/1981 Rothman et al. ........... 438/570
4,283,483 A * 8/1981 Coane ........................ 438/577
4,519,872 A * 5/1985 Anderson et al. ........... 438/623
4,560,435 A * 12/1985 Brown et al. ................. 216/40
4,805,683 A * 2/1989 Magdo et al. ................ 216/40
5,359,928 A 11/1994 Blessington et al.
5,693,455 A 12/1997 Swirbel et al.
5,991,963 A 11/1999 Tourigny
6,101,937 A 8/2000 Murakami
6,110,394 A 8/2000 Cathey et al.
6,228,678 B1 5/2001 Gilleo et al.
6,228,681 B1 5/2001 Gilleo et al.
6,419,803 B1 * 7/2002 Baldwin et al. ....... 204/192.13
6,528,417 B1 * 3/2003 Wang et al. ................ 438/665
6,531,250 B1 3/2003 Kim
6,689,678 B1 * 2/2004 James et al. ................ 438/612
2001/0017414 A1 8/2001 Gilleo
2001/0036711 A1 * 11/2001 Urushima ................... 438/460
2002/0132463 A1 * 9/2002 Urushima ................... 438/613
2003/0042617 A1 3/2003 Lee
2003/0153160 A1 * 8/2003 James et al. ................ 438/438
2004/0084206 A1 * 5/2004 Tung .......................... 174/255

FOREIGN PATENT DOCUMENTS

EP 0 719 638 A2 7/1996

* cited by examiner

*Primary Examiner*—Matthew Smith
*Assistant Examiner*—Joannie Adelle Garcia
(74) *Attorney, Agent, or Firm*—Kerry D. Tweet

(57) ABSTRACT

A stencil and method for depositing a coupon of underfill material onto a substrate that is to receive an integrated circuit die.

19 Claims, 7 Drawing Sheets

STENCIL AND METHOD FOR DEPOSITING MATERIAL ONTO A SUBSTRATE

FIELD OF THE INVENTION

The invention relates generally to the packaging of integrated circuit devices and, more particularly, to a stencil and a method for depositing a quantity of underfill material onto a substrate that is to receive an integrated circuit die.

BACKGROUND OF THE INVENTION

To package an integrated circuit (IC) chip or die, such as a processing device or a memory device, the IC die is typically mounted on a substrate, this substrate often referred to as the "package substrate." The package substrate includes a plurality of leads that are electrically coupled with the leads of the IC chip, as well as circuitry to route signals to and from the die. For a flip-chip package—employing, for example, Controlled Collapse Chip Connect (or "C4") assembly techniques—an array of bond pads on the IC die are coupled to a corresponding array of leads, or "lands", on the package substrate by an array of connection elements (e.g., solder balls, column, etc.). Alternatively, the IC chip bond pads may be connected to the leads on the package substrate using wirebonding or another suitable process.

The circuitry provided by the package substrate routes the IC chip leads to locations on the package substrate where electrical connections can be established with a next-level component (e.g., a motherboard, a computer system, a circuit board, another IC device, etc.). For example, the substrate circuitry may route all signal lines to a ball-grid array—or, alternatively, a pin-grid array—formed on a lower surface of the package substrate. The ball- or pin-grid array then electrically couples the packaged IC die to the next-level component, which includes a mating array of terminals (e.g., lands, pin sockets, etc.). Alternatively, the circuitry may route the signal lines to locations proximate the periphery of the package substrate, wherein wirebonding may be used to couple the packaged IC chip to the next-level component.

The IC die is typically attached to the package substrate using an epoxy or other suitable adhesive. This epoxy forms an "underfill" layer that both attaches the die to the package substrate and provides mechanical support for the die and the electrical connections (e.g., solder elements) between the IC die bond pads and the substrate's leads. To minimize voids in the underfill layer, the adhesive (or "underfill material") is typically deposited on the package substrate in a glob or mound, wherein this glob is dispensed onto the package substrate at a location where the die will be attached. When the die is compressed against the package substrate, the underfill material flows outwardly toward the periphery of the die, such that the underfill material forms a substantially void-free and uniformly thick layer underlying the entire lower surface of the die (or a substantial portion thereof).

An example of the attachment of an IC chip to a package substrate using an underfill material is illustrated in FIGS. 1A through 1C. Referring to FIG. 1A, a package substrate 110 includes a number of leads or lands 115, the lands 115 being arranged in an array. A nozzle 105 or other dispenser (e.g., syringe, dropper, etc.) has dispensed a glob 132 of underfill material (e.g., epoxy) onto an upper surface of the package substrate 110. As shown in FIG. 1B, an IC die 120 has been positioned over the substrate 110. The IC die 120 includes a plurality of connection elements 125, wherein each connection element 125 (e.g., a solder ball, column, etc.) is connected with a bond pad (not shown in figures) on the IC die 120. The connection elements 125 on IC die 120 are arranged in an array corresponding to the arrangement of the lands 115 on the package substrate 110.

Referring now to FIG. 1C, the IC die 120 has been joined with the package substrate 110 to form an IC package 100. The die 120 has been compressed against the substrate 110, and the underfill material 132 has been forced to flow outwardly from the interior of the die 120 toward the periphery thereof to form an underfill layer 130. By placing the underfill material 132 near the center of the substrate (or near the center of the array of lands 115) and forcing this material to flow outwardly under the force of compressing the die 120 against the substrate 110, voids in the underfill layer 130 are minimized and a substantially uniform underfill layer 130 is formed. Solder reflow may then take place to electrically connect each connection element 125 to its mating lead 115 on the package substrate 110 and, if necessary, any post-curing of the underfill layer 130 may be performed. As noted above, the underfill layer 130 attaches the die 120 to the package substrate 110 and also provides mechanical support for the substrate-to-die electrical connections (e.g., leads 115, connection elements 125, and the die bond pads).

Time-pressure type dispensing systems, such as the nozzle 105 shown in FIG. 1A, have proven adequate with respect to deposition of the underfill material at the correct location and in a desired shape (i.e., a shape having a height that is greater than the thickness of the final underfill layer, such that the underfill material flows outwardly under compression of the die against the substrate). However, these time-pressure dispensers are relatively slow, and their use can negatively impact the pace of a production line.

DETAILED DESCRIPTION OF THE INVENTION

Figure 1A:
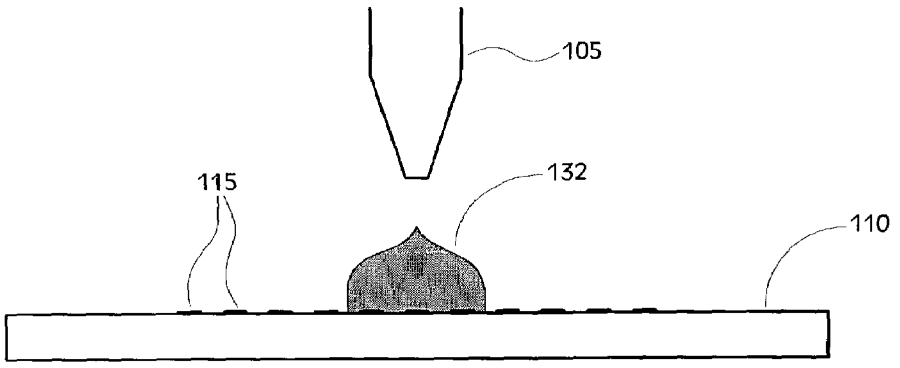
FIGS. 1A through 1C are schematic diagrams illustrating a conventional method of dispensing underfill material between a substrate and an IC device.
Figure 1B:
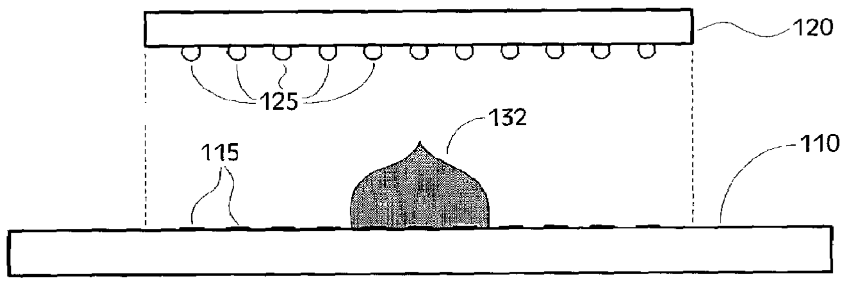
Figure 1C:
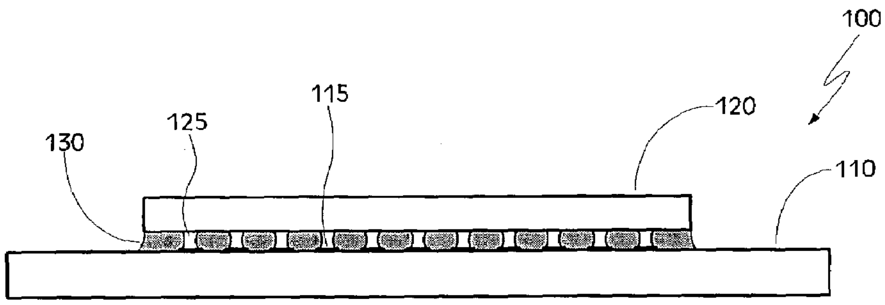
Figure 2A:
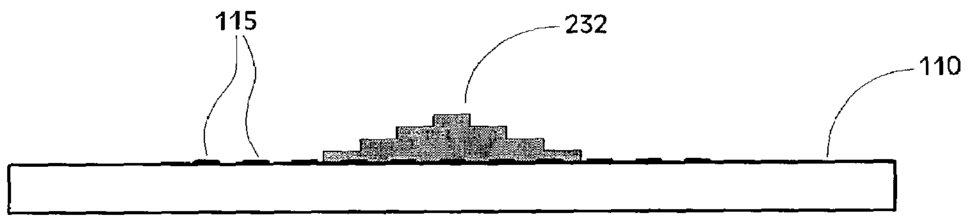
FIGS. 2A through 2C are schematic diagrams illustrating an embodiment of a method of depositing underfill material onto a substrate using a stencil, as disclosed herein.
Figure 2B:
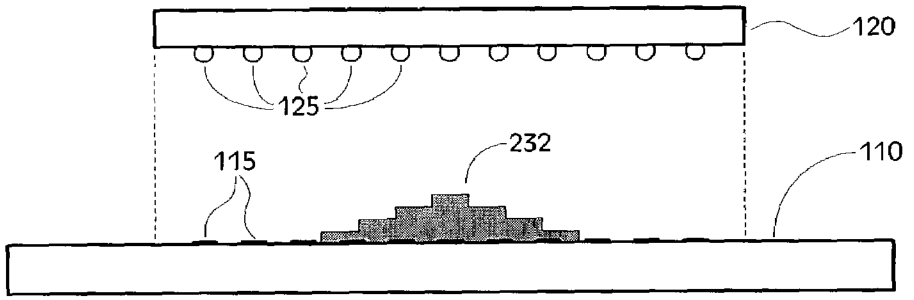
Figure 2C:
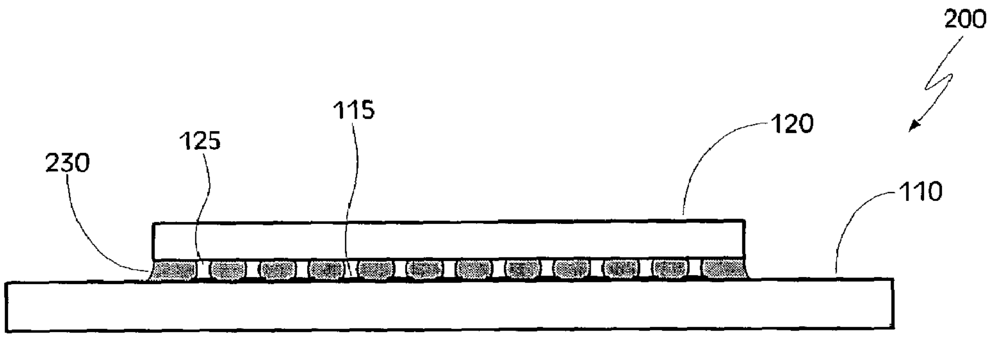

Illustrated in FIGS. 2A–2C is an embodiment of the attachment of an IC die to a package substrate with underfill material that has been deposited on the package substrate using a stencil, as disclosed herein. The disclosed embodiments of the stencil provide an efficient mechanism for depositing a quantity of underfill material onto the substrate, wherein the shape of the deposited material is determined by the stencil design. Embodiments of a stencil and method of depositing material onto a substrate are described herein in the context of attaching an IC die to a package substrate (e.g., the flip-chip attachment of a die to a package substrate using C4 assembly techniques). However, it should be understood that the disclosed embodiments are not so limited in application and, further, that the disclosed stencils and methods may find use in any application where the dispensing of a quantity of material in a desired shape is needed (e.g., attaching a packaged IC device to a next-level component, such as a circuit board).

Referring to FIG. 2A, a substrate 10 (e.g., a package substrate) includes a number of leads or lands 115, the lands 115 being arranged in an array. A quantity of underfill material 232 has been deposited on the substrate 110 using a stencil, which will be described in detail below. The underfill material 232 has been deposited in a pyramidal or "stepped" shape, and this stepped block, or "coupon," of material has a center height that is greater than its peripheral height and that is greater than a height of the final, compressed layer of underfill material between the substrate and a die. Thus, when the stepped coupon of underfill material 232 is compressed between a die and the substrate, the underfill material 232 will flow outwardly underneath the die to form a substantially void-free underfill layer.

As shown in FIG. 2B, an IC die 120 has been positioned over the substrate 110. The IC die 120 includes a plurality of connection elements 125, wherein each connection element 125 (e.g., a solder ball, column, etc.) is connected with a corresponding bond pad (not shown in figures) on the die 120. The connection elements 125 are arranged in an array corresponding to the arrangement of the lands 115 on substrate 110. In one embodiment, the die 120 comprises a flip-chip die that is to be attached to the substrate 110 using C4 assembly techniques.

Tuning to FIG. 2C, the IC die 120 has been joined with the substrate 110 to form a packaged IC device 200. The die 120 has been compressed against the substrate 110, and the underfill material 232 has been forced to flow outwardly from the interior of the die 120 toward the periphery thereof to form an underfill layer 230. The underfill layer 230 attaches the die 120 to the substrate 110 and also provides mechanical support for the substrate-to-die electrical connections (e.g., leads 115, connection elements 125, and the die bond pads). Solder reflow may then be performed to electrically connect each connection element 125 to its mating lead 115 on the substrate 110. Also, if necessary, a post-cure of the underfill layer 230 may be performed.

Figures 3A, 3B, 3C, 3D:
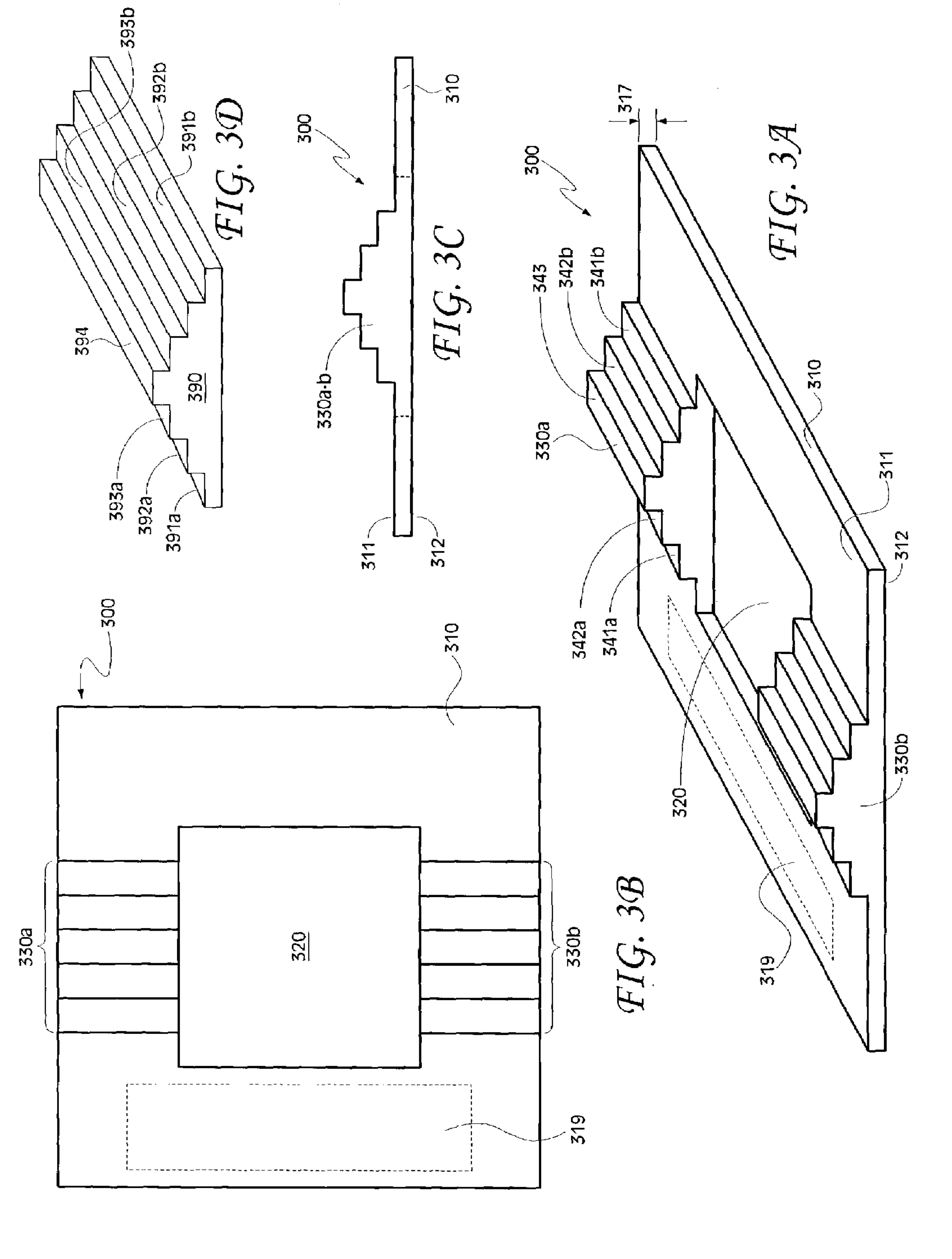
FIG. 3A is a perspective view of one embodiment of a stencil for depositing a quantity of material onto a substrate.
FIG. 3B is a plan view of the stencil illustrated in FIG. 3A.
FIG. 3C is a side elevation view of the stencil illustrated in FIG. 3A.
FIG. 3D is a perspective view of a stepped coupon that may be created using the stencil of FIGS. 3A–3C.
Figure 3F:
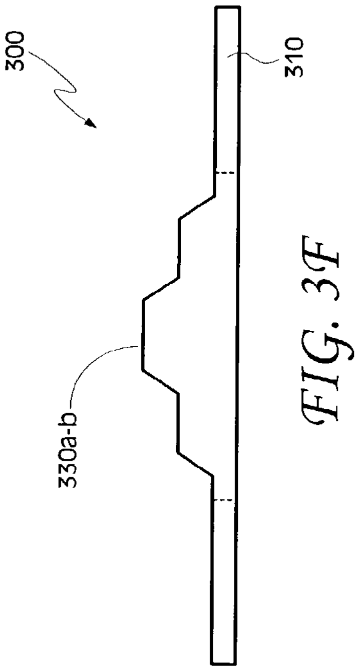
FIGS. 3E–3H each illustrate an alternative embodiment of the stencil of FIGS. 3A–3C.
Figure 3H:
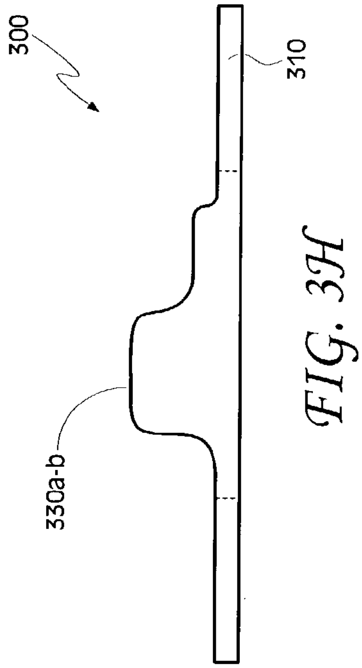
Figure 3E:
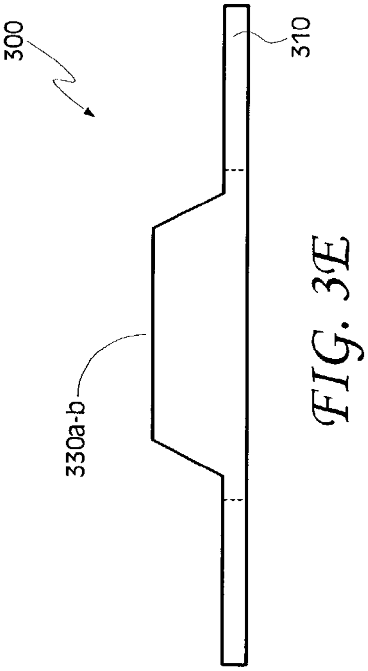
Figure 3G:
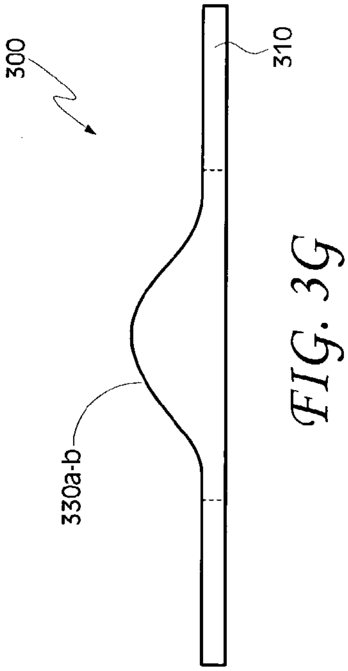

Referring now to FIGS. 3A through 3C, illustrated is an embodiment of a stencil 300 that may be used to create the stepped coupon of material 232 shown in FIGS. 2A and 2B. With reference to FIGS. 3A, 3B, and 3C, the stencil 300 comprises a plate 310 having an upper surface 311 and an opposing lower surface 312. The plate 310 can have any suitable thickness 317 and, in one embodiment, the plate's thickness 317 ranges from 0.1 mm to 1 mm.

Extending through the plate 310 is an aperture 320. The size and shape of the aperture 320 determines the outer dimensions of the coupon that will be formed by the stencil, and the aperture's size and shape is generally matched to the size of a die (or range of die sizes) for which the stencil is designed. In one embodiment, the aperture 320 is generally rectangular in shape or square in shape; however, the aperture 320 may have any suitable shape (e.g., circular). The aperture 320 may have any suitable size depending on the die for which the stencil 300 is designed for. In one embodiment, the aperture 320 comprises a square shape (or, more generally, a rectangular shape) whose edges range between 3 mm and 25 mm in length.

Extending upwardly from the upper surface 311 of plate 310 is one or more raised features, including raised features 330*a*, 330*b*. In one embodiment, as shown in FIGS. 3A–3C, each of the raised features 330*a*, 330*b* comprises a series of steps, including steps 341*a*, 342*a*, 343, 342*b*, 341*b*. Any suitable height and number of steps may be employed, depending on the desired shape of the coupon that is to be formed with the stencil 300. Also, any suitable number of raised features 330*a*–*b* may be employed (e.g., one or more than two).

The stencil 300, including plate 310 having aperture 320 and raised features 330*a*–*b*, may be constructed from any suitable material using any suitable fabrication technique. In one embodiment, the stencil 300 is fabricated using an etching process (e.g., a sequential series of mask and chemical etch steps). In this embodiment, the stencil 300 may be constructed of copper, a copper alloy, stainless steel, or any other material amenable to etching. In another embodiment, the stencil comprises molded plastic or, more generally, is formed from any suitable material using a molding process. In a further embodiment, the stencil 300 is fabricated using an electro-forming process, wherein the stencil comprises a series of layers built up using a metal plating process. Also, in yet another embodiment, the aperture (or apertures) 320 is cut out using a laser.

Shown in FIG. 3D is an embodiment of a stepped coupon 390 of underfill material, as may be created using the stencil 300 of FIGS. 3A–3C. Generally, the coupon 390 will have a shape that matches the shape and configuration of the aperture 320 and, further, that matches the profile of the raised features 330*a*, 330*b* extending upwards from the plate 310. In the embodiment of FIGS. 3A–3D, the stepped coupon 390 has a number of steps, including steps 391*a*, 392*a*, 393*a*, 394, 393*b*, 392*b*, 391*b*, which steps generally match the series of steps of raised features 330*a*, 330*b*. Note that the number of levels (e.g., 4) of steps on the stepped coupon 390 exceeds the number of levels (e.g., 3) of steps in the series of steps of raised features 330*a*, 330*b*. This result occurs because the plate 310 itself results in the formation of one level of steps, wherein the upper surface 311 of plate 310 corresponds to the first level of steps on the coupon 390 (i.e., steps 391*a*, 391*b*).

The disclosed embodiments of the stencil are not limited to the stepped shape shown in FIGS. 2A–2C and 3A–3D. The raised features 330*a*, 330*b* on stencil 300, as well as the coupon 390 formed by the stencil 300, may be of any suitable shape and/or configuration, as desired. This is illustrated in FIGS. 3E through 3H, each of which illustrates an alternative embodiment of the raised features 330*a*–*b* on stencil 300. In general, the profile of the raised features 330*a*–*b* can be tailored to provide any desired shape for a block of material to be deposited using the stencil. The embodiments of the stencil 300 shown in each of FIGS. 3E through 3H may be suitable for a stencil created from molded plastic (or other molded material), whereas the embodiment of stencil 300 shown in FIGS. 3A–3C may be suitable for a stencil fabricated using an etching process.

Illustrated in FIGS. 4A through 4D is a method of depositing a coupon of material using the stencil 300 of FIGS. 3A–3C, and FIG. 5 illustrates a method 500 of depositing a quantity of material using the disclosed stencil. Note that, in each of FIGS. 4A through 4C, the stencil 300 is shown in dashed line. Each of FIGS. 4A–4D and FIG. 5 should be referenced in the following discussion, as called out in the text.

Figure 4A:
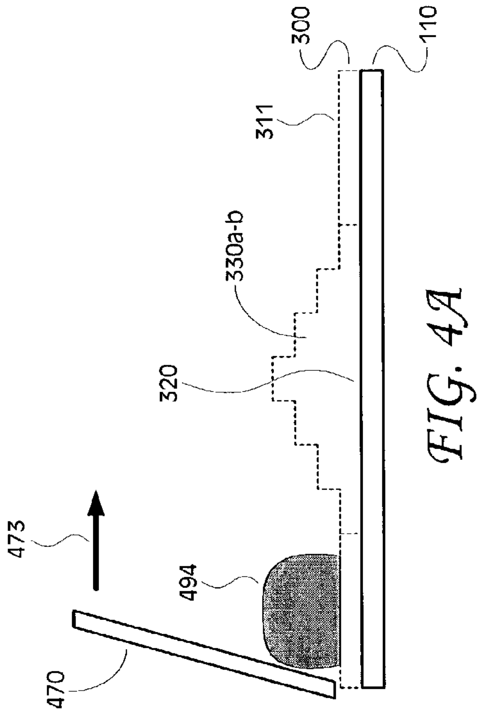
FIGS. 4A–4D are schematic diagrams illustrating an embodiment of a method of depositing a stepped coupon of underfill material on a substrate using the disclosed stencil.
Figure 5:
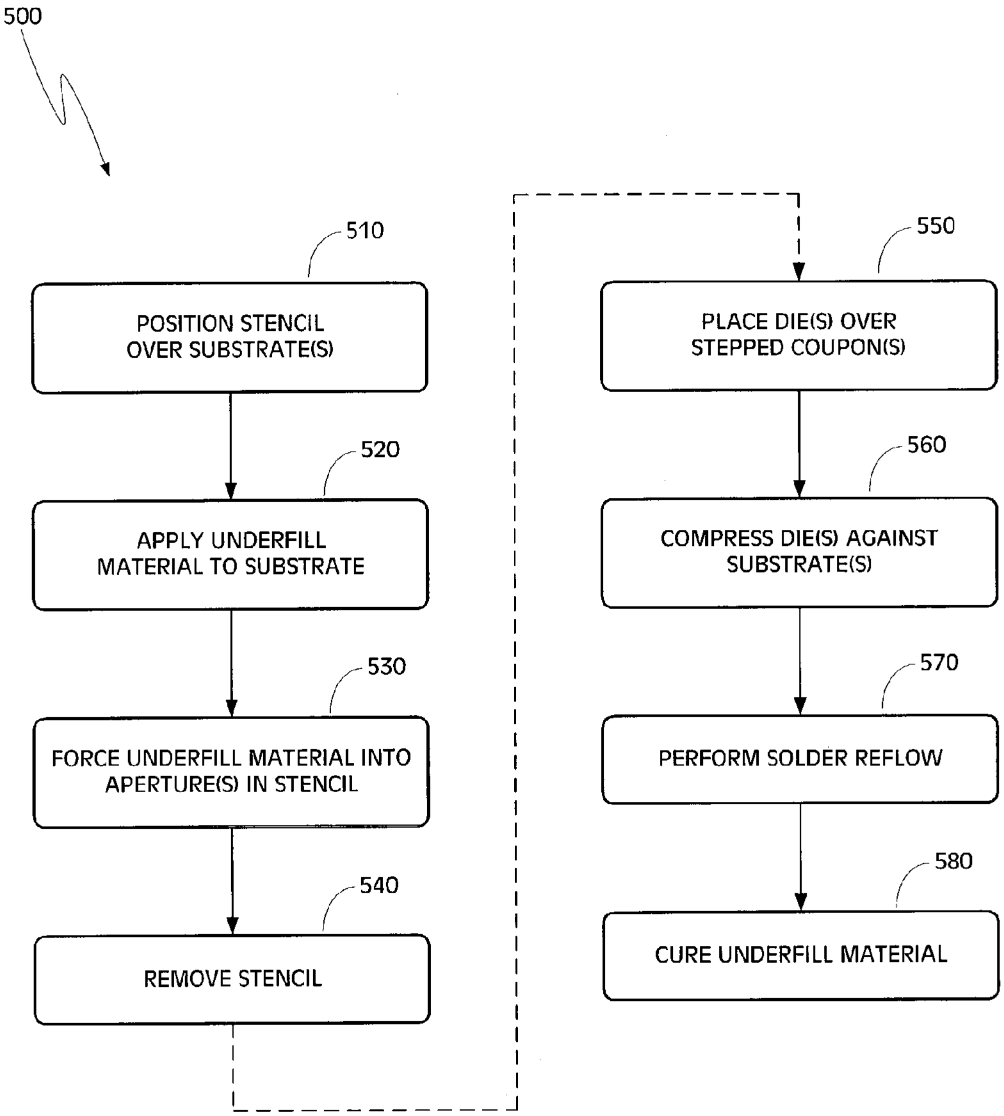
FIG. 5 is a block diagram illustrating an embodiment of a method of depositing a coupon of underfill material onto a substrate using the disclosed stencil.

Referring to block 510 in FIG. 5, a stencil is positioned over a substrate, and underfill material is applied to the stencil, as shown at block 520. Generally, the underfill material is deposited on the stencil's upper surface at a location adjacent the aperture (e.g., in the region 319 shown in dashed line in FIGS. 3A and 3B). This is shown in FIG. 4A, where the stencil 300 (shown in dashed line) has been positioned over a substrate 110, and underfill material 494 has been disposed on the upper surface 311 of the stencil 300 at a location adjacent the aperture 320. The underfill material 494 may comprise any suitable adhesive or other bonding agent, such as an epoxy. In one embodiment, the underfill material includes a flux or other cleaning agent to assist in solder reflow. In another embodiment, the underfill material includes a filler material (e.g., silica) to alter the mechanical and/or thermal properties of the underfill material. For example, a filler may be added to increase the strength of the underfill material and/or a filler may be added to adjust the thermal properties of the underfill material to match those of the die and/or substrate. The volume of underfill material 494 should at least substantially equal the volume of the coupon of material to be formed and, in one embodiment, the volume of underfill material exceeds the amount of material needed to produce the coupon.

Figure 4B:
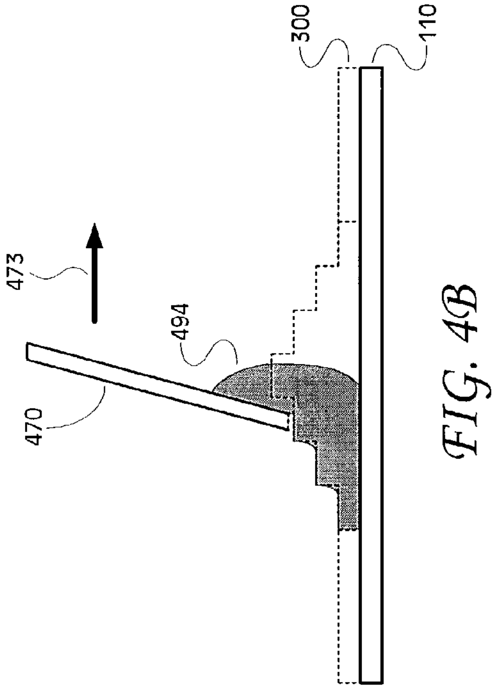
Figure 4C:
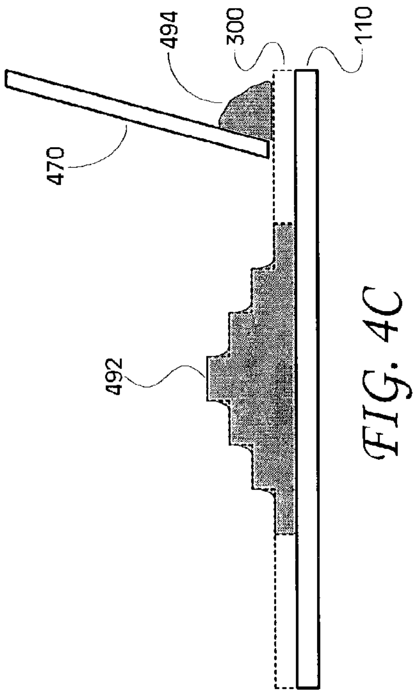

Returning to FIG. 5, the underfill material is forced into the aperture 320 in the stencil 300, as shown at block 530. The underfill material may be forced to flow into the aperture 320 using any suitable device, such as a squeegee, blade, roller, or similar device. This is illustrated in FIGS. 4A through 4C. Referring to FIG. 4A, a squeegee device 470 is moved over the upper surface 311 of the stencil 300 in a direction toward the aperture 320 (see arrow 473). The underfill material 494 is forced into the aperture 320 as the squeegee 470 travels over the upper surface 311 and the raised features 330*a–b* of the stencil 300, as shown in FIG. 4B. In FIG. 4C, the squeegee 470 has completed one pass over the aperture 320 and raised features 330*a–b* of the stencil 300, and the quantity of underfill material forced into the aperture 320 generally conforms to the shape of the aperture 320 and raised features 330*a–b*. Note that some underfill material 494 may remain on the upper surface 311 of the stencil 300. The squeegee 470 may make additional passes over the aperture 320 and raised features 330*a–b*, as necessary to fill the space within the aperture 320 and raised features 330*a–b*. Further, in one embodiment, the underfill material 494 is pre-heated to improve its flow characteristics prior to being forced into the aperture 320. The pre-heat temperature may range from 80° C. to 120° C.

Figure 4D:
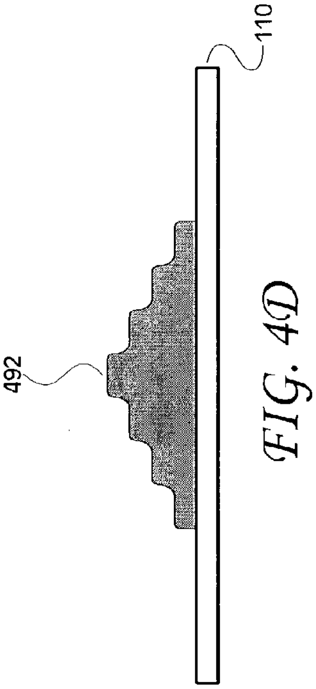

Turning again to FIG. 5, the stencil may be removed from the substrate, as illustrated at block 540. This is shown in FIG. 4D, where the stencil 300 has been lifted off the substrate 110, leaving a stepped coupon 492 on an upper surface of the substrate 110. It should be understood that, due to the motion of the squeegee 470 (or other device used to cause the underfill material to flow into the aperture 320) as it traverses the profile (e.g., the steps) of the raised features 330*a–b*, the coupon 490 may not precisely conform to the profile of the raised features 330*a–b* (e.g., see rounded comers of coupon 492, as shown in FIG. 4D).

Referring back to FIG. 5, further embodiments of the method 500 are illustrated in each of block 550 through 580. In one embodiment, as shown at block 550, a die is placed over the stepped coupon 492 (see FIG. 2B). In another embodiment, this die is compressed against the substrate (see FIG. 2C), thereby causing the underfill material of the stepped coupon 492 to flow outwardly toward the periphery of the die, as shown at block 560. The compressive force applied between the die and substrate may, in one embodiment, range from 4.9 N to 98.1 N (e.g., as may be obtained by placing a mass over the die of between 0.5 Kg and 10 Kg). In a further embodiment, which is illustrated in block 570, solder reflow is performed to electrically couple bond pads on the substrate with leads on the die (e.g., by reflowing solder elements coupled with the die leads). The underfill material sets up and solidifies around the solder joints; however, the underfill material may achieve a gel state rather than becoming fully cured. Thus, in yet another embodiment, as shown at block 580, the underfill material is cured (e.g., as by heating), if necessary.

The method described in blocks 510 through 540 of FIG. 5 (as well as the embodiments of blocks 550 through 580) may be repeated for other substrates (and die), and the same stencil 300 may be re-used for multiple substrates. In one embodiment, the stencil 300 is designed for use with a specified die size, and the stencil may be re-used for multiple die-attach operations of the specified die size. In another embodiment, the stencil 300 is designed for use with a range of die sizes, and the stencil 300 may be re-used for multiple die-attach operations of varying die sizes.

Thus far, a stencil having a single aperture for forming a single coupon has been described. However, the disclosed embodiments are not limited to this case. In another embodiment, a stencil includes multiple apertures and raised features to form a number of coupons. This embodiment is illustrated in FIGS. 6A through 6C.

Figure 6A:
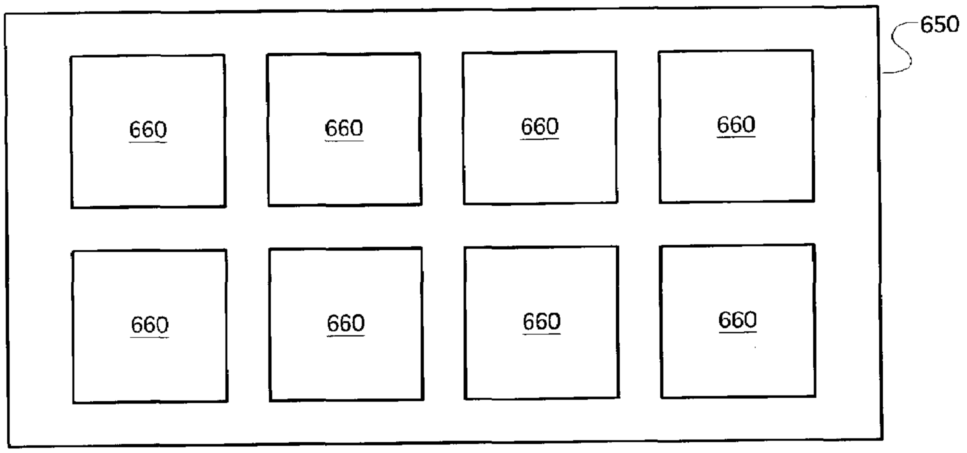
FIG. 6A is a plan view of a carrier holding a plurality of substrates.

Referring to FIG. 6A, a number of substrates 660 (e.g., package substrates) are disposed in a carrier 650 (e.g., a tray, tape, or similar device for holding a plurality of substrates). The substrates 660 are arranged on the carrier 650 in a two-by-four array. A typical carrier may measure 6 inches by 12 inches and hold between 8 and 12 substrates, depending upon their size. However, a carrier may be as small as 2 inches across (e.g., a carrier for a single substrate or a single row of substrates).

Figure 6B:
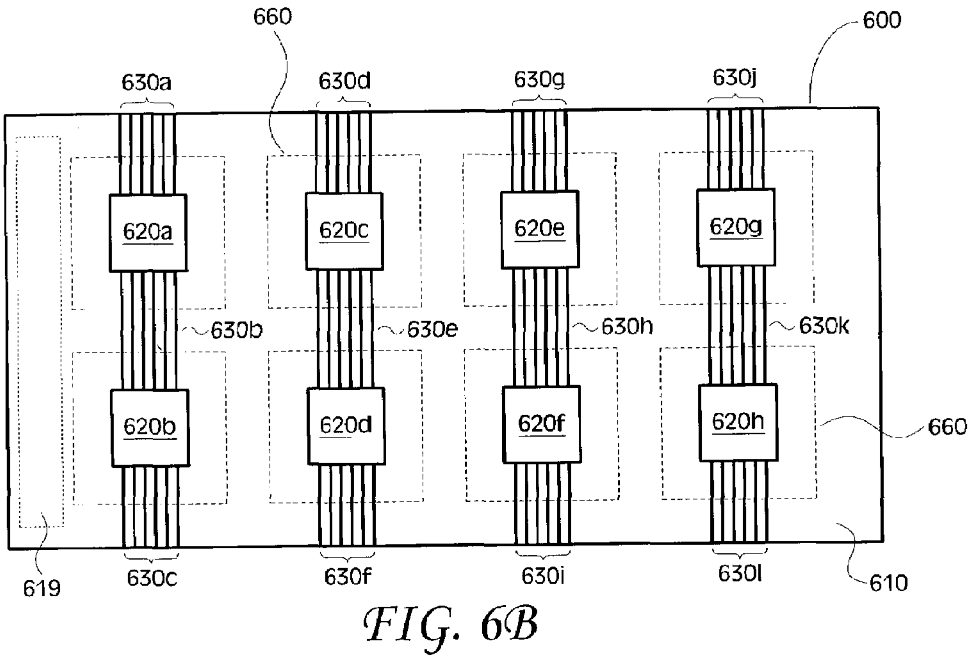
FIG. 6B is a plan view of an embodiment of a stencil having a number of apertures, the stencil disposed over the carrier of FIG. 6A.
Figure 6C:
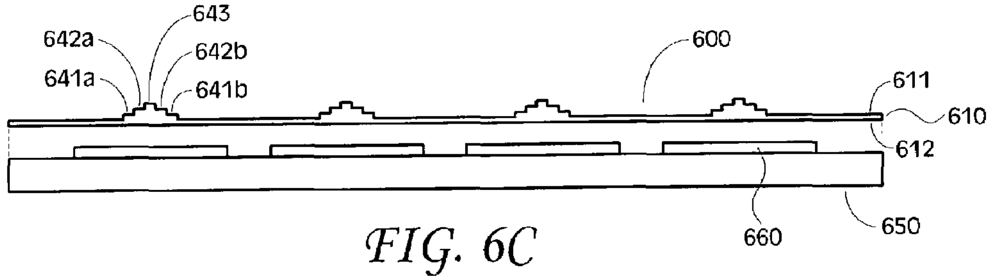
FIG. 6C is a side elevation view of the three-dimensional stencil and carrier of FIGS. 6A and 6B, respectively.

Referring now to FIGS. 6B and 6C, a stencil 600 is positioned over the carrier 650 and the plurality of substrates 660 (note that, in FIG. 6C, the stencil 600 is shown vertically offset from the carrier and substrates for clarity). The stencil 600 comprises a plate 610 having a number of apertures, including apertures 620*a* through 620*h*, wherein the apertures are generally arranged in a pattern matching the array of substrates 660 on carrier 650. Located proximate a periphery of the apertures 620*a–h* and extending upwards from an upper surface 611 of the plate 610 are a number of raised features, including raised features 630*a* through 630*l*, as illustrated in FIGS. 6B and 6C. In one embodiment, each of the raised features 630*a–k* comprises a series of steps, including steps 641*a*, 642*a*, 643, 642*b*, 641*a*, as shown in FIG. 6C. The stencil 600 may be fabricated in a manner similar to that described above for the stencil 300 of FIGS. 3A–3C (e.g., by etching a metal or other suitable material, molded plastic, electro-forming, etc.).

The stencil 600 may be used to deposit a number of coupons of underfill material onto the substrates 660—i.e., one coupon on each substrate—held in the carrier 650. Formation of the coupons would proceed in a similar manner as that described above with respect to FIGS. 4A–4D and FIG. 5. Underfill material is dispensed onto the upper surface 611 at one end of the plate 610 in a region 619 adjacent some of the apertures (e.g., apertures 620*a*, 620*b*). However, as the squeegee (or other similar device) travels over the stencil 600, underfill material is forced into all of the apertures 620*a*–*h*. Thus, during one operation, multiple coupons can be deposited onto a number of substrates, thereby providing a much more efficient process for the manufacturing environment. The stencil 600 may also be re-used, as described above.

Embodiments of stencil 300, 600 for forming a coupon (e.g., a stepped coupon) of material on a substrate, as well as embodiments of a method 500 for forming such a coupon on a substrate, having been herein described, those of ordinary skill in the art will appreciate the advantages of the disclosed embodiments. The disclosed stencil enables the deposition onto a substrate of a coupon having a shape that will provide the flow characteristics desired for the underfill layer in an IC package. Formation of the coupon, or a number of such coupons, is relatively fast and requires few manufacturing steps. The stencils can be fabricated using well-known, low-cost chemical etch processing techniques, and the stencils can be re-used multiple times. Further, the disclosed embodiments can be used with existing stenciling equipment.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A stencil for depositing material on a substrate, comprising:

a plate having an upper surface and an opposing lower surface, the plate locatable over the substrate with the lower surface facing a surface of the substrate, the plate removable from the substrate surface after deposition of the material and reusable to deposit material on other substrates;

an aperture extending through the plate; and a raised feature located proximate a periphery of the aperture and extending upwards from the upper surface of the plate;

wherein the aperture, when receiving a quantity of the material, provides a space for formation of a coupon of the material that substantially conforms in shape to the aperture and the raised feature.

2. The stencil of claim 1, wherein the raised feature comprises a number of steps.

3. The stencil of claim 1, further comprising:

a second raised feature located proximate the periphery of the aperture and extending upwards from the upper surface of the plate.

4. The stencil of claim 1, wherein the aperture is substantially rectangular in shape.

5. The stencil of claim 1, wherein the aperture is substantially square in shape.

6. The stencil of claim 1, wherein the plate comprises a metal or a plastic material.

7. A stencil for depositing material on a substrate, comprising:

a plate having an upper surface and an opposing lower surface, the plate locatable over the substrate with the lower surface facing a surface of the substrate, the plate removable from the substrate surface after deposition of the material;

an aperture extending through the plate;

a first raised feature located proximate a periphery of the aperture and extending upwards from the upper surface of the plate; and a second raised feature located proximate the periphery of the aperture and extending upwards from the upper surface of the plate;

wherein the aperture, when receiving a quantity of the material, provides a space for formation of a coupon of the material having a shape substantially corresponding to the aperture and the first and second raised features.

8. The stencil of claim 7, wherein the coupon comprises a stepped coupon.

9. The stencil of claim 7, wherein each of the first and second raised features comprises a number of steps.

10. The stencil of claim 7, wherein the plate comprises a metal.

11. The stencil of claim 10, wherein the plate comprises a material selected from a group consisting of copper, copper alloys, and stainless steels.

12. The stencil of claim 7, wherein the plate, the first raised feature, and the second raised feature comprise a single part.

13. The stencil of claim 7, wherein the plate comprises a molded plastic.

14. The stencil of claim 7, wherein the stencil is formed by an etching process or an electro-forming process.

15. The stencil of claim 7, wherein the aperture is rectangular in shape.

16. The stencil of claim 7, wherein the aperture is square in shape.

17. The stencil of claim 7, further comprising:

a second aperture extending through the plate;

a third raised feature located proximate a periphery of the second aperture and extending upwards from the upper surface of the plate; and a fourth raised feature located proximate the periphery of the second aperture and extending upwards from the upper surface of the plate;

wherein the second aperture, when receiving a quantity of the material, provides a space for formation of a coupon of the material having a shape substantially corresponding to the second aperture and the third and fourth raised features.

18. The stencil of claim 17, wherein the shape of the coupon formed by the second aperture is substantially identical to the shape of the coupon formed by the aperture.

19. The stencil of claim 17, wherein one of the first and second raised features and one of the third and fourth raised features comprise one raised feature disposed between the second aperture and the aperture.

* * * * *

UNITED STATES PATENT AND TRADEMARK OFFICE

CERTIFICATE OF CORRECTION

PATENT NO. : 7,129,590 B2
APPLICATION NO. : 10/438526
DATED : October 31, 2006
INVENTOR(S) : Watson It is certified that error appears in the above-identified patent and that said Letters Patent is hereby corrected as shown below:

In column 6, at line 3, delete "comers" and insert --corners--.

Signed and Sealed this

Third Day of March, 2009

JOHN DOLL

*Acting Director of the United States Patent and Trademark Office*